(12) United States Patent
Tanaka

(10) Patent No.: US 7,754,400 B2
(45) Date of Patent: Jul. 13, 2010

(54) METHOD FOR DETERMINING AN ACCEPTABLE RETICLE TOLERANCE FOR A RETICLE USED TO PRODUCE AN INTEGRATED CIRCUIT LAYOUT

(75) Inventor: Yasushi Tanaka, Somers, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1033 days.

(21) Appl. No.: 11/442,036

(22) Filed: May 26, 2006

(65) Prior Publication Data

US 2007/0275310 A1 Nov. 29, 2007

(51) Int. Cl.
*G03F 9/00* (2006.01)
(52) U.S. Cl. .................. 430/30; 430/5; 716/19
(58) Field of Classification Search .............. 430/5, 430/30; 716/19
See application file for complete search history.

(56) References Cited

U.S. PATENT DOCUMENTS

| | | | |
|---|---|---|---|
| 6,370,679 B1 | 4/2002 | Chang et al. | 716/19 |
| 6,578,188 B1 | 6/2003 | Pang et al. | 716/19 |
| 6,658,640 B2 | 12/2003 | Weed | 716/19 |
| 6,989,323 B2 | 1/2006 | Doris et al. | 438/596 |
| 6,993,741 B2 | 1/2006 | Liebmann et al. | 716/19 |
| 2001/0026448 A1* | 10/2001 | Koizumi et al. | 362/268 |
| 2005/0188338 A1 | 8/2005 | Kroyan et al. | 716/9 |
| 2005/0251771 A1 | 11/2005 | Robles | 716/5 |

* cited by examiner

*Primary Examiner*—Christopher G Young
(74) *Attorney, Agent, or Firm*—Stuart H. Mayer, Esq.; Karin L. Williams, Esq.; Mayer & Williams PC

(57) ABSTRACT

A method and apparatus is provided for determining an acceptable reticle tolerance for a reticle used to produce an integrated circuit layout. The method begins by specifying a wafer target CD and a wafer CD tolerance for the integrated circuit layout. A reticle target CD is provided for the reticle that is producing the wafer target CD. A critical reticle pattern pitch is selected for the reticle target CD. The critical pattern pitch defines a relationship between the wafer CD and illumination dose exposing the reticle for producing the wafer CD which exhibits a maximum gradient. For the critical reticle pattern pitch, a relationship is established between wafer CD and a deviation from the reticle target CD that arises from use of different illumination doses. From the relationship between wafer CD and the deviation from the reticle target CD, a reticle target CD deviation interval is identified that gives rise to the wafer CD tolerance that is provided. Finally, the reticle target CD deviation interval is selected as the acceptable reticle tolerance.

4 Claims, 4 Drawing Sheets

METHOD FOR DETERMINING AN ACCEPTABLE RETICLE TOLERANCE FOR A RETICLE USED TO PRODUCE AN INTEGRATED CIRCUIT LAYOUT

FIELD OF THE INVENTION

The present invention relates generally to photolithographic methods employed in the manufacture of integrated circuits such as very large-scale integrated (VLSI) circuits and more specifically to improved methods for generating patterns of masks or reticles.

BACKGROUND OF THE INVENTION

Semiconductor devices or integrated circuits (ICs) can include millions of devices such as transistors. For instance, ultra-large scale integrated (ULSI) circuits can include complementary metal oxide semiconductor (CMOS) field effect transistors (FET). Despite the ability of conventional systems and processes to fabricate millions of devices on an IC, because of technical and market pressures, there is still a need to decrease the size of IC device features, and, thus, increase the number of devices on an IC.

In a conventional integrated circuit design process, a circuit designer begins with a conceptual idea of what functions an integrated circuit is to perform. The circuit designer then creates a circuit design on a computer and verifies it using one or more simulation tools to ensure that the circuit will operate as desired. The design at this stage may be represented by what is commonly viewed as a circuit schematic, but may also be represented by higher level abstractions within the computer. These abstract designs are then converted to physical definitions of the circuit elements to be fabricated. These definitions, often called the circuit design or layout, represent the geometric boundaries for the physical devices to be fabricated—transistor gates, capacitors, resistive interconnecting wires, etc.

One limitation to achieving further reductions in the size of IC devices is conventional photolithography. In photolithography, a circuit design is transferred onto a surface or wafer by shining a light through a mask (or reticle in step-and-repeat projection systems) of the design onto a photosensitive material covering the surface. Resolution enhancement techniques (RETs), such as optical and process correction (OPC), may be used in the formation of the mask to pre-compensate for the expected optical distortions that occur in the photolithographic process. The light directed onto the mask exposes the photo-sensitive material in the pattern of the mask. A chemical process etches away either the exposed material or the unexposed material, depending on the particular process that is being used. Another chemical process etches into the wafer wherever the photosensitive material was removed. The result is the design itself, either imprinted into the wafer where the surface has been etched away, or protruding slightly from the wafer as a result of the surrounding material having been etched away.

In order to accomplish high device packing densities, smaller and smaller feature sizes are required. This includes the width and spacing of conductive features and the surface geometry, such as corners and edges of various features. Currently technologies can achieve feature sizes, i.e., critical dimensions, of 130 nm, 90 nm, and even 65 nm. It is anticipated that future design rules will require technologies that can achieve feature sizes of 45 nm and 32 nm.

Each design rule technology requires the variance in the critical dimension (CD) of that feature size to be tightly controlled. For example, in 90 nm technology an acceptable line width variance may be +/−20 nm. In determining an acceptable line width variance for smaller feature size technology, it has been customary to simply reduce the acceptable line width variance from the previous technology by a proportionate amount. For instance, in going from 90 nm technology to 65 nm technology, feature sizes have been reduced by about 30%. Accordingly the acceptable line width variance for 65 nm technology may be assumed to be reduced by about 30% of +/−20 nm, resulting in a variance of about +/−14 nm.

Variances in the CD of a feature can be attributed to inaccuracies in the mask or reticle used to produce that feature. Accordingly, as integrated circuit designs become more complicated, it becomes increasingly important that the masks used in photolithography are accurate representations of the original design layout. Unfortunately, it is unrealistic to assume that the masks can be produced without error. In the typical manufacturing process, some mask errors do occur, which may be outside the allowed variances. For instance, FIG. 1 illustrates a graph 100 plotting critical dimension (CD) values (x-axis) versus occurrences, i.e., the number of masks produced (y-axis) for a given process. A wafer fabrication company can develop a curve 101 based on a wide range of masks. Any mask having CD values between a CD lower limit 102 and a CD upper limit 103 would be considered an acceptable mask for that process.

As feature sizes continue to decrease, it becomes more and more important to ensure that the variance in the CD which can be tolerated is accurately determined. Unfortunately, simply reducing the variance from previous technologies does not ensure that the correct variance will be selected.

SUMMARY OF THE INVENTION

In accordance with the present invention, a method and apparatus is provided for determining an acceptable reticle tolerance for a reticle used to produce an integrated circuit layout. The method begins by specifying a wafer target CD and a wafer CD tolerance for the integrated circuit layout. A reticle target CD is provided for the reticle that is producing the wafer target CD. A critical reticle pattern pitch is selected for the reticle target CD. The critical pattern pitch defines a relationship between the wafer CD and illumination dose exposing the reticle for producing the wafer CD which exhibits a maximum gradient. For the critical reticle pattern pitch, a relationship is established between wafer CD and a deviation from the reticle target CD that arises from use of different illumination doses. From the relationship between wafer CD and the deviation from the reticle target CD, a reticle target CD deviation interval is identified that gives rise to the wafer CD tolerance that is provided. Finally, the reticle target CD deviation interval is selected as the acceptable reticle tolerance.

In accordance with one aspect of the invention, the integrated circuit layout employs a 90 nm design rule.

In accordance with another aspect of the invention, the integrated circuit layout employs a 65 nm design rule.

In accordance with another aspect of the invention, the integrated circuit layout employs a design rule of less than 90 nm.

In accordance with another aspect of the invention, a method is provided for determining an acceptable reticle tolerance for a reticle used to produce an integrated circuit layout. The method begins by specifying a wafer target CD and a wafer CD tolerance for the integrated circuit layout. An acceptable reticle tolerance is selected based on a range of illumination dosages that can be used to expose the reticle while producing a wafer that meets the wafer target CD within the specified wafer CD tolerance.

In accordance with another aspect of the invention, from a relationship between wafer CD and a deviation from the reticle target CD, a reticle target CD deviation interval is identified that gives rise to the wafer CD tolerance that is specified.

In accordance with another aspect of the invention, the step of selecting an acceptable reticle tolerance includes providing a reticle target CD for the reticle producing the wafer target CD. A critical reticle pattern pitch is selected for the reticle target CD, wherein for the critical pattern pitch a relationship between wafer CD and illumination dose exposing the reticle for producing the wafer CD exhibits a maximum gradient. For the critical reticle pattern pitch, a relationship is established between wafer CD and a deviation from the reticle target CD that arises from use of different illumination doses. From the relationship between wafer CD and the deviation from the reticle target CD, a reticle target CD deviation interval is identified that gives rise to the wafer CD tolerance that is provided. The reticle target CD deviation interval is selected as the acceptable reticle tolerance.

In accordance with another aspect of the invention, an apparatus is provided for performing lithography. The apparatus includes a coherent source of light and a reticle to be illuminated by the coherent source of light. The reticle has a CD that is within an acceptable tolerance. The acceptable tolerance is within a value that arises from specifying a wafer target CD and a wafer CD tolerance for an integrated circuit layout and the value is selected based on a range of illumination dosages that can be used to expose the reticle while producing a wafer that meets the wafer target CD within the specified wafer CD tolerance. The apparatus also includes an optical arrangement for focusing light that passes through the reticle. An optical arrangement is provided for focusing light that passes through the reticle onto a wafer having a photosensitive surface.

DETAILED DESCRIPTION

As detailed below, the present invention provides a reticle for use in a lithography process. The tolerance or variance of the critical dimensions (CDs) on the reticle are sufficiently small to ensure that the resulting wafer CDs are within tolerances specified by the circuit layout.

Figure 2:
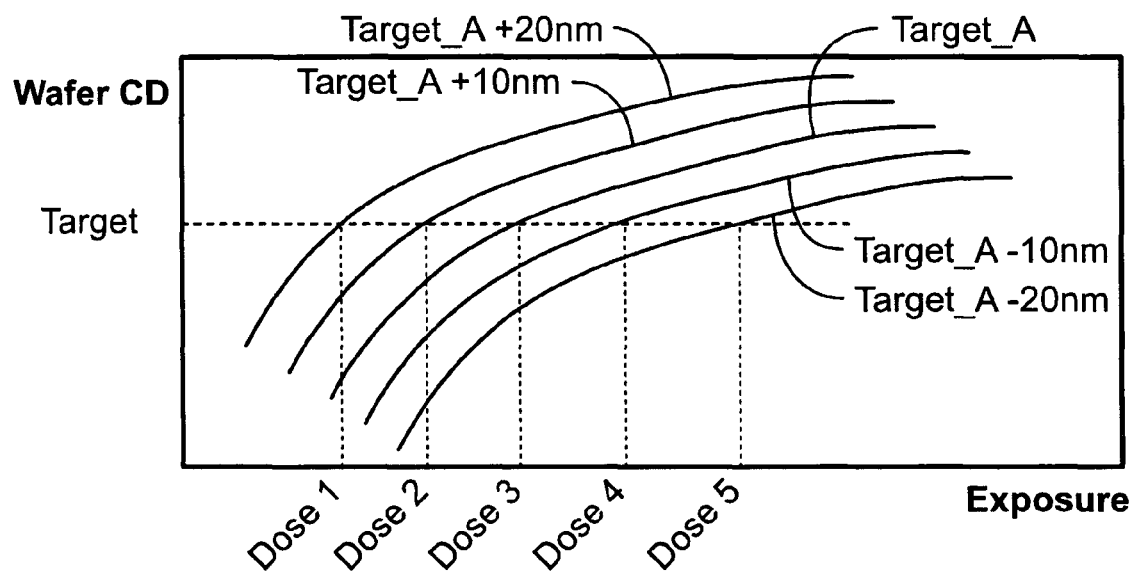
FIG. 2 is a graph showing the critical dimension (CD) of a feature produced on a wafer versus the dosage of illumination used to expose the wafer through a reticle or mask.

It is well known that mask errors will generally vary with the geometrical configuration of the mask layout. In particular, mask errors will vary with the pitch of the pattern employed in a mask layout. A pitch is defined as a minimum center-to-center distance between two features or patterns, such as interconnect lines, pads, or pins. FIG. 2 is a graph showing the critical dimension (CD) of a feature produced on a wafer versus the dosage of illumination used to expose the wafer through a reticle or mask. For purposes of the following discussion, the terms mask and reticle will be used interchangeably. The horizontal dashed line indicates a target CD that is be achieved. The target CD in this example is denoted CD3. The wafer target CD is generally specified by the design requirements of the circuit that is to be produced. Along with the wafer target CD, a tolerance or error in the target CD is generally also specified. To produce the wafer, a reticle CD is specified. In FIG. 2 this specified reticle CD required to produce the wafer target CD is denoted the Target A reticle specification. For this target reticle specification, a curve is shown that represents the wafer CD resulting from the use of different illumination dosages. As shown, the wafer CD generally increases with increasing dosage. FIG. 2 also shows four additional curves for reticle CDs that deviate from the Target A reticle specification by −10 nm, −20 nm, +10 nm and +20 nm, respectively. As the figure indicates, each of these different reticles can produce a wafer with the target CD of CD3 by using different dosages of illumination. For instance, while the target A reticle requires a dosage of "3" to achieve the wafer target CD, a reticle that deviates from Target A by +20 nm only requires a dose of "1" and a reticle that deviates from Target A by −10 nm requires a dose of "4."

It should be noted that the curves in FIG. 2 are only applicable for one particular pitch (e.g., the spacing between recurring lines or features). In the current example the pitch refers to the spacing between adjacent mask patterns produced on the same structure. The particular pitch selected in FIG. 2 is the pitch that has the smallest process window (i.e., the pitch having the smallest process parameter space, where the process parameters include such things as the dosage, NA, focus and other parameters that can produce the target CD). If a different pitch were employed, the gradient or slope of the curves in FIG. 2 generally would be different.

Figure 3:
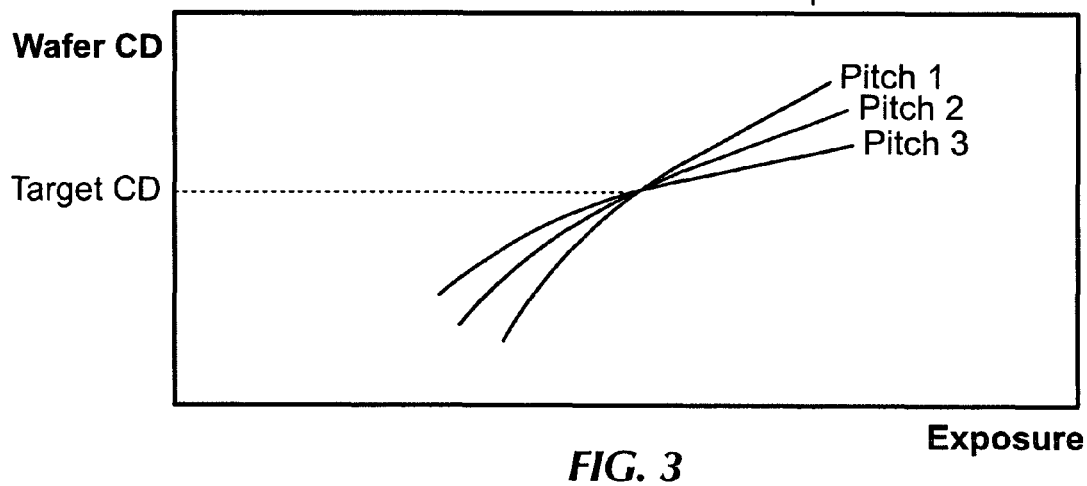
FIG. 3 is a graph showing the CD of a feature produced on a wafer versus the dosage of illumination used to expose the wafer through a reticle or mask having a fixed reticle CD.

Similar to FIG. 2, FIG. 3 is a graph showing the CD of a feature produced on a wafer versus the dosage of illumination used to expose the wafer through a reticle or mask. Once again, the target CD is denoted CD 3. In FIG. 3, however, the reticle CD used to achieve the wafer target CD is fixed. The three curves represent three different pitches. As noted above, the slopes of the curves are different for the different pitches. The pitch that yields the steepest slope is denoted the critical pitch, in this case pitch 1. The significance of the critical pitch is as follows. For a small change Δ in exposure, the resulting deviation from the wafer target CD will be greater for the critical pitch than for other pitches. That is, the critical pitch is the pitch that results in the largest wafer CD error with a change in illumination dosage.

Figure 1:
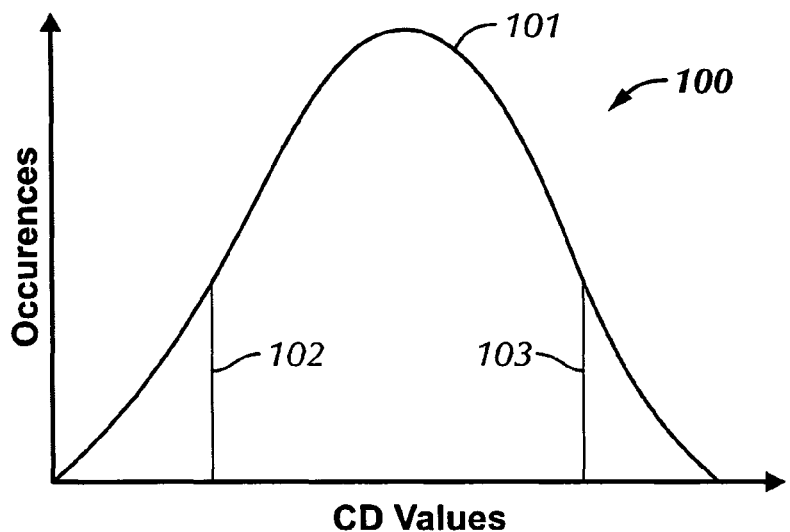
FIG. 1 illustrates a graph 100 plotting critical dimension (CD) values (x-axis) versus the number of masks produced (y-axis) for a given process.
Figure 4:
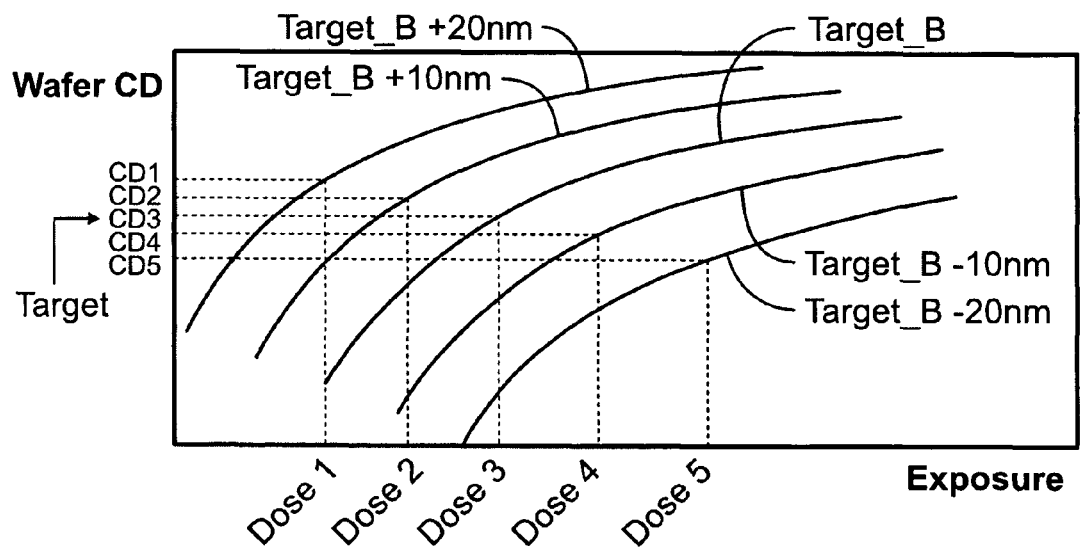
FIG. 4 is a graph showing the critical dimension (CD) of a feature produced on a wafer versus the dosage of illumination used to expose the wafer through a reticle or mask for the critical pitch determined in FIG. 3.

FIG. 4 is similar to FIG. 2 except whereas FIG. 2 is shown for the pitch that has the smallest process window, FIG. 4 is shown for the critical pitch determined in FIG. 3. In FIG. 4 the reticle CD required to produce the wafer target CD is denoted the Target B reticle specification. In both FIGS. 1 and 2 the wafer target CD is CD3. Clearly, if the reticle CD deviates from its target value of B by a given amount, the change in dosage required to achieve the wafer CD is greater for the critical pitch in FIG. 4 than for the pitch in FIG. 2. For instance, in both figures a dosage of 3 produces the wafer target CD when the reticles are at their respective target CDs. However, if in FIG. 2 the reticle CD deviates by say, +10 nm, a dosage of 2 will achieve the same wafer target CD. On the other hand, in FIG. 4, for the critical pitch, if the reticle CD deviates by 10 nm, a dosage of less than 2 will achieve the same wafer target CD. By maximizing the change in dosage that is needed to achieve a wafer target CD for a given change in the reticle CD, the variance in the reticle CD that is acceptable is also maximized. The value of this variance can be determined from FIG. 5.

Figure 5:
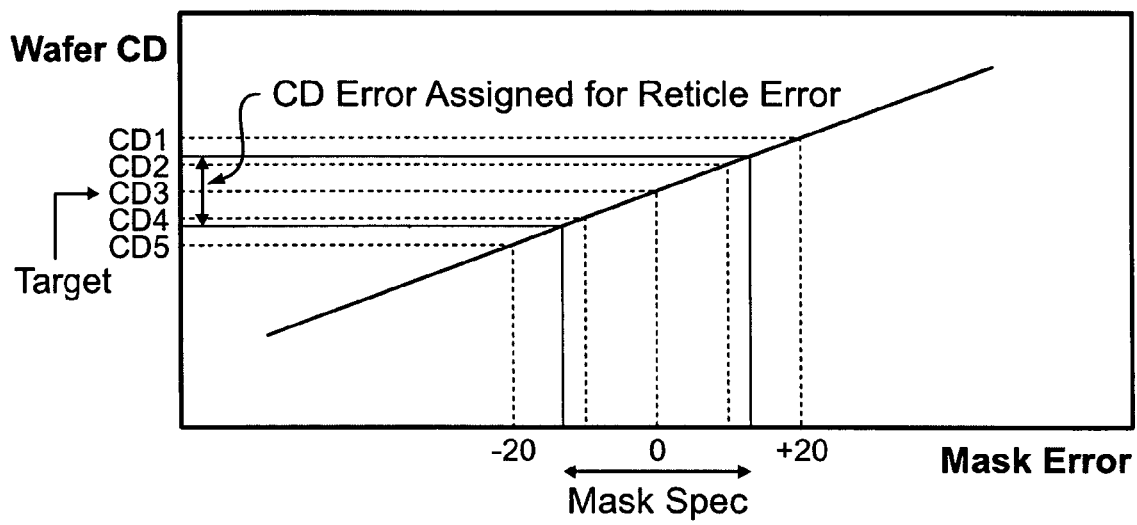
FIG. 5 is a graph showing the wafer CD versus the deviation in the reticle CD from its specified target value.

FIG. 5 re-plots the data available from FIG. 4 so that it may be used to select a maximum acceptable tolerance on the reticle specification. In particular, FIG. 5 is a graph showing the wafer CD versus the deviation in the reticle CD from its specified target value. In this case the wafer has a target CD of CD3 and the circuit design requirements specify that the wafer CD can deviate from CD3 by no more than an amount corresponding to the difference between CD2 and CD4. The reticle error that can be tolerated is thus seen to be about +/−12 nm.

Figure 6:
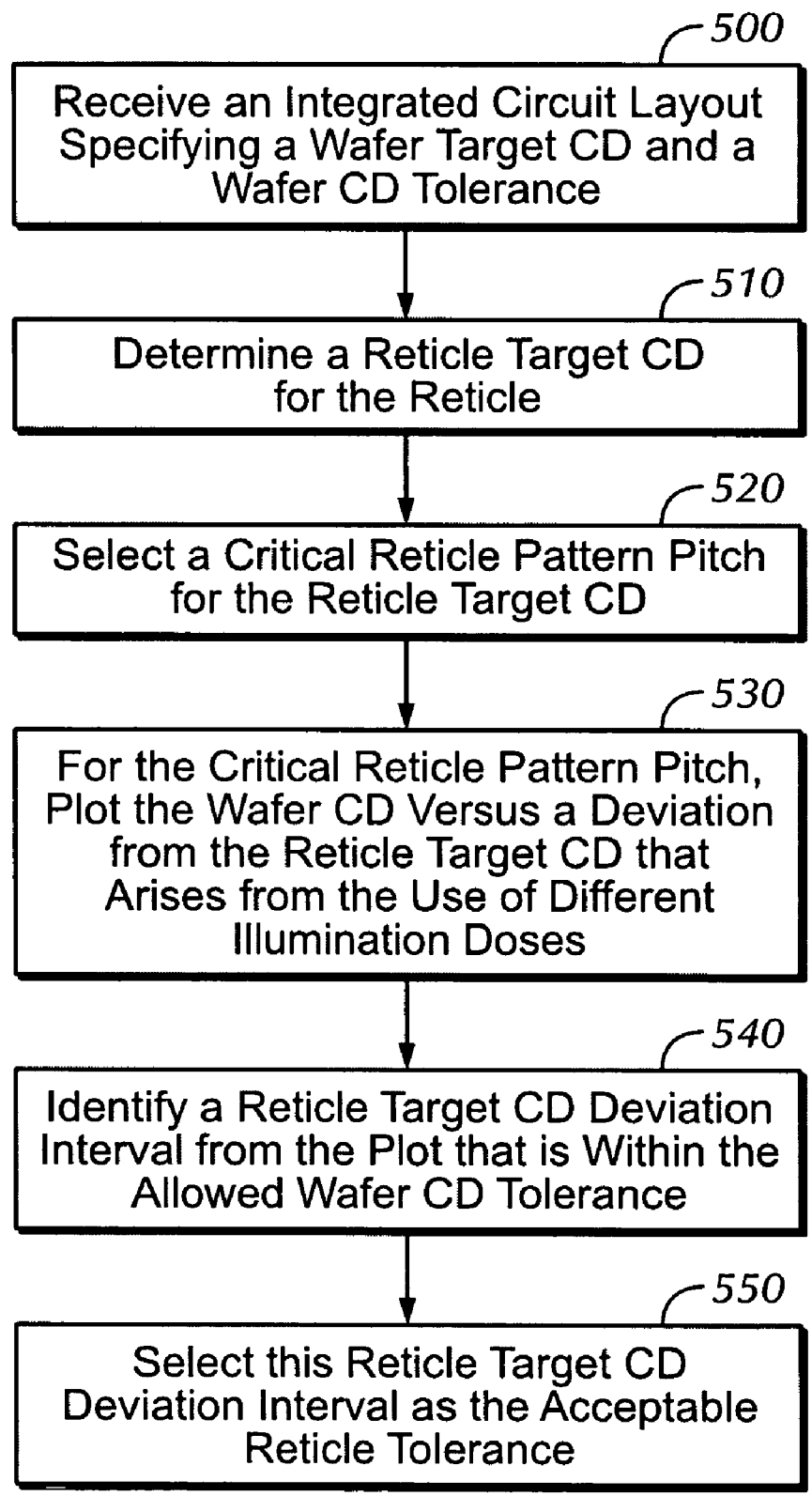
FIG. 6 is one example of a process flow that may be employed to determine an acceptable reticle tolerance for a reticle that is used to produce an integrated circuit layout.

FIG. 6 is one example of a process flow that may be employed to determine an acceptable reticle tolerance for a reticle that is used to produce an integrated circuit layout. In step 500 an integrated circuit layout is specified that includes a wafer target CD and a wafer CD tolerance. Next, in step 510, a reticle target CD is determined for the reticle that is to produce the wafer target CD. A critical reticle pattern pitch for the reticle target CD is selected in step 520. The critical pattern pitch is determined from a relationship between the wafer CD and the illumination exposure dose that is used to produce the wafer. The critical pattern pitch is the pitch for which this relationship exhibits a maximum gradient. In step 530, for the critical reticle pattern pitch, a relationship is established between the wafer CD and a deviation from the reticle target CD that arises from the use of different illumination doses. From the relationship between wafer CD and the deviation from the reticle target CD, a reticle target CD deviation interval is selected in step 540. The reticle target CD deviation interval includes those reticle target CD deviations that give rise to a wafer CD that meets the wafer target CD within the allowed wafer CD tolerance that is included with the integrated circuit layout. Finally, in step 550 this reticle target CD deviation interval is selected as the acceptable reticle tolerance.

Figure 7:
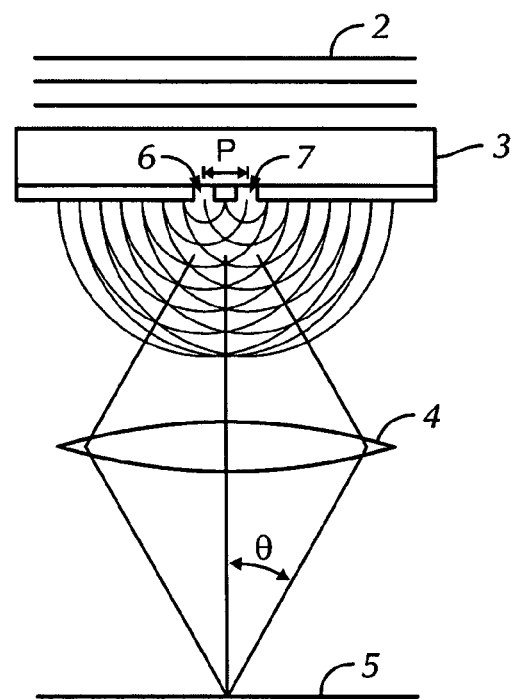
FIG. 7 shows a simplified schematic illustration of an illustrative optical lithography system in which the reticles that are produced with tolerances determined in accordance with the present invention can be used.

The reticles that are produced with tolerances determined in accordance with the present invention can be used in an optical lithography system, a simplified schematic illustration of which is presented in FIG. 7. A coherent plane of light 2, characterized by its wavelength $\lambda$, illuminates reticle 3, which can be seen as an opaque stencil of the desired pattern. The light passing through the openings in the reticle 3 is focused by lens optics 4 onto an image plane of a wafer 5.

The invention claimed is:

1. A method for determining an acceptable reticle tolerance for a reticle used to produce an integrated circuit layout, comprising:

specifying a wafer target CD and wafer CD tolerance for the integrated circuit layout;

providing a reticle target CD for the reticle producing the wafer target CD;

selecting a critical reticle pattern pitch for the reticle target CD, wherein for said critical pattern pitch a relationship between wafer CD and illumination dose exposing the reticle for producing the wafer CD exhibits a maximum gradient;

for the critical reticle pattern pitch, establishing a relationship between wafer CD and a deviation from the reticle target CD that arises from use of different illumination doses;

from the relationship between wafer CD and the deviation from the reticle target CD, identifying a reticle target CD deviation interval that gives rise to the wafer CD tolerance that is provided; and selecting the reticle target CD deviation interval as the acceptable reticle tolerance.

2. The method of claim 1 wherein the integrated circuit layout employs a 90 nm design rule.

3. The method of claim 1 wherein the integrated circuit layout employs a 65 nm design rule.

4. The method of 1 wherein the integrated circuit layout employs a design rule of less than 90 nm.

* * * * *